United States Patent
Bortolussi

(10) Patent No.: US 6,791,314 B1
(45) Date of Patent: Sep. 14, 2004

(54) DEVICE AND METHOD FOR MEASURING WEAK CURRENT SIGNALS USING A FLOATING AMPLIFIER

(75) Inventor: Claude Bortolussi, Blagnac (FR)

(73) Assignee: Siemens Automotive S.A., Toulouse (FR)

( * ) Notice: Subject to any disclaimer, the term of this patent is extended or adjusted under 35 U.S.C. 154(b) by 0 days.

(21) Appl. No.: 09/913,931

(22) PCT Filed: Feb. 15, 2000

(86) PCT No.: PCT/EP00/01229

§ 371 (c)(1),
(2), (4) Date: Aug. 20, 2001

(87) PCT Pub. No.: WO00/49420

PCT Pub. Date: Apr. 24, 2000

(30) Foreign Application Priority Data

Feb. 18, 1999 (FR) ............................................ 99 01979

(51) Int. Cl.[7] ............................................. G01R 31/34
(52) U.S. Cl. ...................................... 324/126; 324/772
(58) Field of Search ........................... 324/117 R, 126, 324/127, 772, 545, 142; 318/490; 327/51–54

(56) References Cited

U.S. PATENT DOCUMENTS

| | | | |
|---|---|---|---|
| 4,096,436 A | * 6/1978 | Cook et al. | 324/142 |
| 4,360,879 A | * 11/1982 | Cameron | 702/60 |
| 4,374,359 A | * 2/1983 | Missout | 324/96 |
| 5,336,990 A | * 8/1994 | Maue | 324/126 |
| 5,498,984 A | * 3/1996 | Schaffer | 327/51 |
| 5,585,746 A | * 12/1996 | Franke | 327/54 |
| 5,701,253 A | * 12/1997 | Mayell et al. | 702/60 |

FOREIGN PATENT DOCUMENTS

JP   6-030579   2/1994

* cited by examiner

Primary Examiner—Kamand Cuneo
Assistant Examiner—Russell M Kobert
(74) Attorney, Agent, or Firm—Young & Thompson

(57) ABSTRACT

A device for measuring current in a line supplied by a voltage with noise includes a shunt mounted in series in the line, a floating shunt signal amplifier, a floating supply to supply the floating amplifier with a voltage that follows the supply voltage of the shunt, and a differential amplifier whose inputs are connected, on the one hand, to an input terminal of the shunt, and, on the other hand, to the output of the floating amplifier.

6 Claims, 2 Drawing Sheets

DEVICE AND METHOD FOR MEASURING WEAK CURRENT SIGNALS USING A FLOATING AMPLIFIER

The invention relates to a device and a process for measuring current using the amplification of low value signals. It relates particularly to the field of automobile power steering.

Although the device usually used for automotive vehicle power steering uses a DC motor, it is envisaged to use an asynchronous triphase motor.

In power steering of an automotive vehicle, it is indispensable, to manage the control strategy, to know the torque applied by the power steering motor, and hence, in the case of a triphase motor, to know the electrical current passing through the three phases. The corresponding measurement is carried out by a shunt by using the conventional formula $U = R \times I$.

Moreover, when the vehicle driver turns the steering wheel slowly, a high demultiplication ratio between the shaft and the steering cannot be used because it would become very difficult for the driver to turn the steering wheel in case of failure of the system. It is thus necessary to use a motor with a high torque (in particular for "heavy" vehicles), even at low speed, and to apply to it a vectorial control which is actually the only one which permits a substantial torque at almost zero speed.

In practice, the electric motor used has a power which can be of the order of 500 watts, and it is supplied by continuous chopped voltage (the three phases are obtained by substantially rectangular chopping of the voltage from a vehicle battery, and smoothed by using the self effect of the motor itself). The frequency used is of the order of 15 to 25 KHz (namely substantially the top of the standard audio band).

To measure the voltage of the terminals of a shunt mounted in series on a phase of the electric motor (the shunt oscillating between ground and battery voltage, at cutout frequency), it is obviously desirable to reduce the heat loss by the Joule effect in the shunt (lost proportional to the square of the electrical strength passing through the shunt).

The strength being here of the order of 100 amperes, a shunt of 1 mÙ already has a power loss from heat of 10 watts. It will thus be understood that, because of this, the tendency is to seek to reduce further the value of the shunt.

The consequence of this choice of low shunt value is that the voltage finally measured at the terminals of the shunt is, for a shunt of 1 mÙ, of the order of 100 mV.

The problem is thus to carry out on the shunt a current measurement that is sufficiently precise, from a voltage whose order of magnitude is about 100 mV, and which acts on a chopped voltage from the 12 volt battery (the ratio is thus about 1% between the voltage to be measured and the chopped voltage), and chopped at a high frequency of the order of 15 to 25 KHz, in the presence of noise in the chopped voltage, particularly at each voltage shock (rising or falling voltage front).

Figure 1:
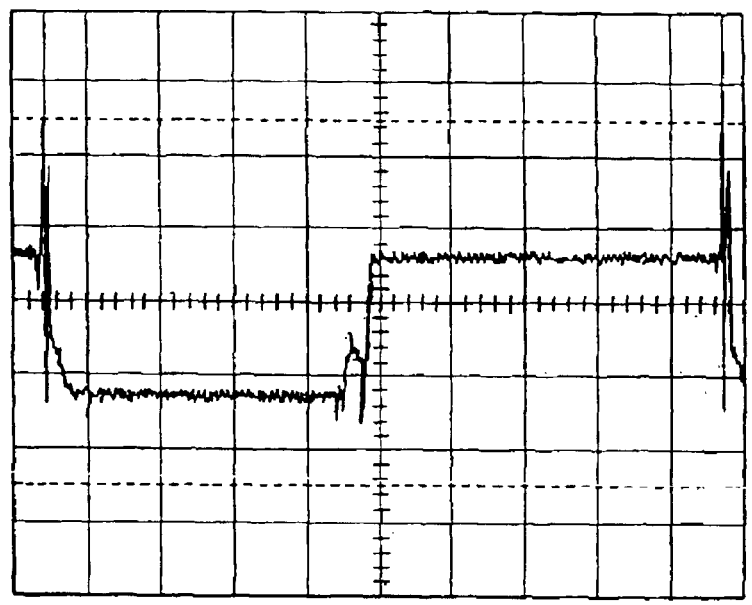

The conventional differential amplifiers do not permit precise reading of the voltage at the terminals of the shunt, because the measurement is very much disturbed at each chopping transition. FIG. 1 shows the signal obtained by such a conventional differential amplifier for a value of maximum current.

The present invention meets the problem set forth above, and provides for this purpose, with the corresponding process, a device that is simple to make and low cost, permitting amplification and measurement of weak signals.

According to the invention, for measuring current in a line supplied by a voltage with noise and comprising a shunt mounted in series, there is used an amplifier of the signal of the shunt, hereafter called a floating amplifier, and means to supply said floating amplifier with a voltage which follows the supply voltage of the shunt.

It will be understood that the principle of the invention is to amplify the useful signal to facilitate its extraction from the chopped signal. To do this, the amplifier of the shunt signal is supplied with a voltage which follows the potential of the shunt.

The invention similarly provides for the application of the device and of the process which is its object, to a current measurement in a supply line of an asynchronous motor.

According to particular arrangements that may be used in combination:

the electric motor is of the triphase type,
the electric motor is supplied by a chopped voltage,
the electric motor has a power of about 500 watts,
the shunt has a value of about 1 mÙ,
the device comprises a differential amplifier whose inputs are connected on the one hand to the input of the shunt and, on the other hand, to the output of the so-called floating amplifier,
the floating amplifier has its inputs connected to the terminals of the shunt and is supplied from a mounting of the double bootstrap type.

These arrangements are favorable to a production of the device with conventional components, without particular requirements and hence of low cost, which makes the production of the device economical.

Finally, the invention provides, according to another aspect, the application of the device and of the process which is its object, to electrical power steering for an automotive vehicle.

Generally speaking, when there is involved a measurement of weak current in a line supplied by a voltage with noise, and comprising a shunt mounted in series, the process of the invention is characterized in that it comprises the step of signal amplification of the potential difference between the input and output terminals of the shunt by an amplifier supplied by a voltage which follows the supply voltage of the shunt.

Preferably, it moreover comprises a step of differential amplification of the difference between, on the one hand, the signal of the chopped voltage at the input of the shunt, and, on the other hand, the potential difference at the terminals of the shunt, amplified by the floating amplifier.

It is important to note that this problem of measuring weak current in the shunt in the presence of voltage noise is in fact new in an application of electrical power steering, to the extent to which most of the previously existing devices used DC motors, of lower power (100 to 150 watts). There thus was no particular problem to measure a voltage at the terminals of a shunt connected to the ground or to the battery voltage (because of the absence of chopping).

Present DC motors operate by using brushes, which give rise to a problem of wear, and which would not be usable in practice for motors of 500 watts. Moreover, the choice of having a constant torque no matter what the steering, and to reduce "torque oscillations" that now exist in power steering with DC motors with brushes, leads to using triphase asynchronous motors, and hence to introduce a chopped voltage, comprising a not inconsiderable voltage noise.

The invention is thus applicable more generally to all so-called "brushless" electrical motors, or to motors which do not operate with DC.

The description and drawings which follow permit better understanding the objects and advantages of the invention. It is clear that this description is given only by way of example, and not in a limiting way.

Figure 2:
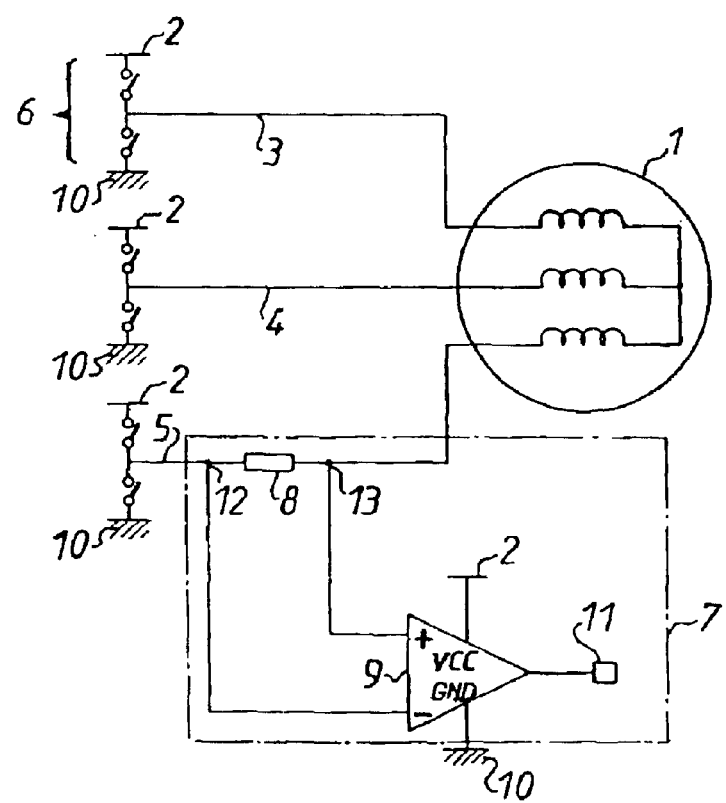
Figure 3:
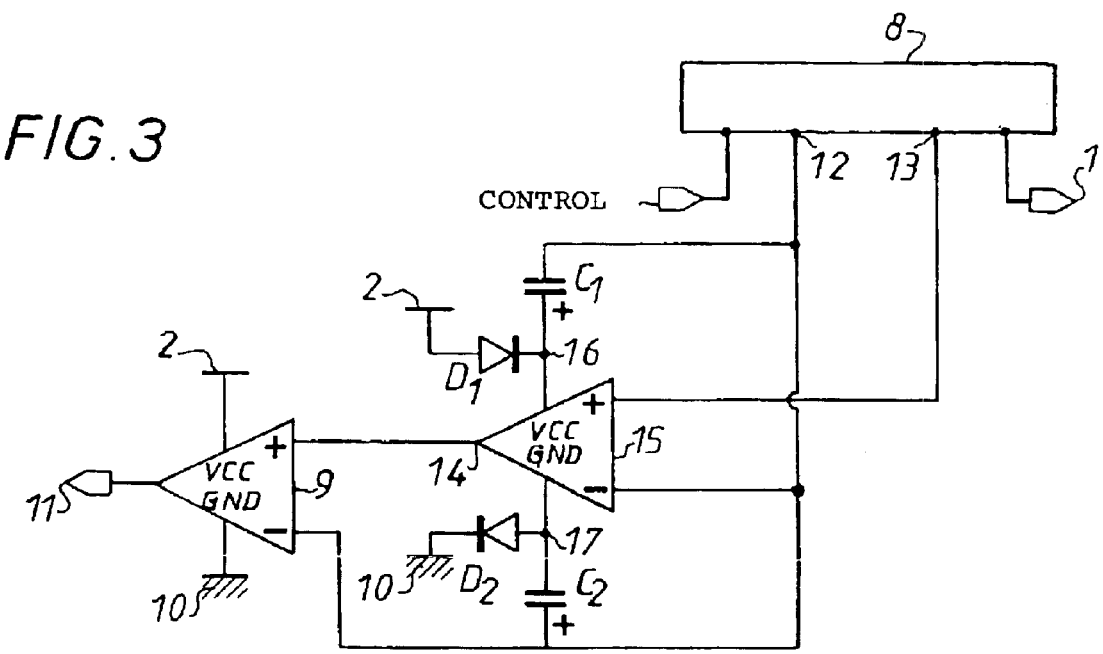
Figure 4:
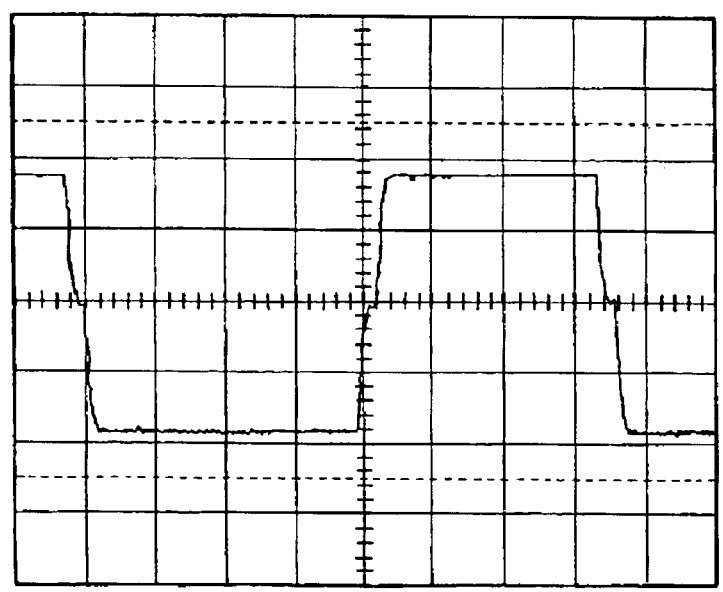

In the drawings:

FIG. 1 shows the noise present in a chopped voltage supplying a triphase electric motor, FIG. 2 shows schematically a device for measuring a signal from a shunt, not according to the invention, FIG. 3 shows schematically, in an analogous manner, a measuring device according to the invention, FIG. 4 shows the measured signal, after use of the device according to the invention.

As is seen in FIG. 2, a triphase asynchronous motor 1, for example adapted to act on an automotive vehicle steering, is supplied by a battery 2 (of the 12 volt type) via three supply lines 3, 4, 5. A chopping device 6, of a conventional nature (rapid switch), and not shown in detail here, is inserted in each supply line of the motor 1, as is also a control device (not shown) for the motor 1.

It is thus sought to determine the current flowing in the electrical lines 3, 4, 5. To do this, a low current measuring device 7 is disposed in one line (here designated 5) for supplying the motor 1.

This device 7 first of all comprises a shunt 8, of conventional type, of a value of about 1 mÙ, and an amplification means, which in the embodiment illustrated in FIG. 2 and not according to the invention, is comprised by a differential amplifier 9 mounted at the terminals 12, 13 of the shunt 8 ("+" terminal at the output terminal 13 of the shunt, and "−" terminal at the input terminal 12 of the shunt), and supplied between the battery 2 and a ground 10. A processing device for the measurement 11, not shown in detail here, receives the signal from the differential amplifier 9.

It is seen above that the use of such a measuring device gives rise to the observation of a signal as shown in FIG. 1, hence with a great deal of noise and difficult to use.

The device according to the invention is thus shown in FIG. 3. It will be seen that it comprises, in addition to the differential amplifier 9, whose inputs are connected on the one hand, for the "−" terminal, to the input terminal 12 of the shunt 8, and, on the other hand, for the "+" terminal, at the output 14, to a so-called floating amplifier 15.

This floating amplifier 15 has its inputs connected to the terminals 12, 13 of the shunt 8 ("+" terminal to the output terminal 13 of the shunt, and "−" terminal to the input terminal 12 of the shunt). It is supplied by floating supply means constituted by a mounting of the double bootstrap type.

More precisely, a terminal of voltage VCC of said floating amplifier 15 is connected to the battery 2 through a diode D1. A condenser C1 is mounted between the input terminal 12 of the shunt and the cathode 16 of the diode D1.

Similarly, a voltage terminal GND (or VEE) of the floating amplifier 15 is connected to the ground 10 via a diode D2. A condenser C2 is mounted between the input terminal 12 of the shunt and the anode 17 of the diode D2.

In operation, the chopped signal from the battery has a voltage increasing between 0 and 12 volts. During positive alternation of the chopping (substantially 12 volts), the chopped battery voltage (12+ÄU) is imposed on the condenser C2 of "−" supply of the floating amplifier 15, via the diode D2, and the voltage Vee will then be substantially equal to the input voltage of the shunt (12+ÄU) (terminal 12) LESS 12 volts, namely ÄU. The voltage Vcc is substantially equal to the input voltage of the shunt (12+ÄU) PLUS 12 volts (discharge from C1), and the difference Vcc–Vee equals 24 volts.

During negative alternation of chopping (substantially 0 volt), this chopped battery voltage 0+ÄU is applied to the condenser C1 of "+" supply of the floating amplifier 15, via the diode D1, and the voltage Vcc thus equals substantially the input voltage of the shunt 0+ÄU (terminal 12) PLUS 12 volts. The voltage Vee is equal substantially to the input voltage of the shunt 0+ÄU (terminal 12) LESS 12 volts (discharge of C2), namely ÄU–12 volts, and the difference Vcc–Vee equals 24 volts in this case again.

The floating amplifier 15 is thus supplied at a voltage twice that of the battery 2, if influence of switching elements is omitted. And this supply follows the shunt potential (independence relative to ÄU, hence from chopping shocks). There has thus been provided in this case a symmetrical floating supply of the floating amplifier 15, which follows the input potential of the shunt 8.

The floating amplifier 15 thus supplied is accordingly adapted to amplify the signal between the terminals of the shunt 8, independently of the noise existing in the supply voltage.

There is thus amplified by the floating amplifier 15 the difference signal of voltage between the input terminals 12 and the output terminals 13 of the shunt 8.

The differential amplifier 9 operates itself with, as inputs, on the one hand the chopped voltage signal at the input 12 of the shunt 8, and on the other hand the potential difference at the terminals of the shunt 8, amplified by the floating amplifier 15.

The comparison between these signals with a conventional differential amplifier 9 is thus much easier than in the absence of amplification of the potential difference at the terminals 12, 13 of the shunt 8.

Thus, in the absence of amplification of the potential difference at the terminals of the shunt 8, the noise in the supply voltage is high before the difference of voltage at the terminals of the shunt (value to be measured), and the differential amplifiers hence less satisfactory. On the contrary, after amplification of the potential difference of the terminals of the shunt, the noise in the supply voltage becomes less relative to the amplified signal, and the differential amplifier performs well.

Stated another way, it is possible to carry out measurement of the current with very low shunt values, because with the floating supply used, it is possible to amplify the weak signal obtained, and then to reference this amplified signal to the overall ground, by minimizing the errors introduced in the differential stage.

FIG. 4 shows the actual embodiment of the invention, with maximum current, and it will be seen that the distortions of commutation are the exact reflection of the behavior of the power switches.

A significant advantage of this mounting is that it is thus possible to use a differential amplifier 9 of conventional type, and hence of low cost, and similarly to use a floating amplifier 15 which is also conventional and low cost. This contributes to reducing the cost of production of the device.

The scope of the present invention is not limited by the details of the embodiments given above, considered by way of example, but extends on the contrary to modifications within the scope of those skilled in the art.

What is claimed is:

1. Device for measuring current in a line (5) supplied by a voltage with noise, comprising:
   a shunt (8) mounted in series in the line (5);
   a floating shunt signal amplifier (15);
   a floating supply means (C1, C2, D1, D2) to supply said floating amplifier (15) with a voltage that follows the supply voltage of the shunt (8); and a differential amplifier (9) whose inputs are connected, on the one hand, to an input terminal (12) of the shunt (8), and, on the other hand, to the output (14) of the floating amplifier (15).

2. Device according to claim 1, characterized in that the line (5) is a supply line of an asynchronous triphase electric motor (1), said electric motor (1) being supplied by a chopped voltage, having a power of about 500 watts, and in that the shunt (8) has a value of about 1 mΩ.

3. Device according to claim 1, characterized in that the floating amplifier (15) has its inputs connected to the terminals (12, 13) of the shunt (8) and in that the floating supply means (C1, C2, D1, D2) is constituted by a first voltage connection to a battery positive voltage source and a second voltage connected to ground a negative voltage source.

4. Device according to claim 3, characterized in that the floating supply means comprises:

the connection of a terminal of voltage VCC of said floating amplifier (15) to a battery (2) via a diode D1, and the mounting of a condenser C1 between the input terminal (12) of the shunt and the cathode (16) of the diode D1, and the connection of a terminal of voltage GND (or VEE) of the floating amplifier (15) to the ground (10) via a diode D2 and the mounting of a condenser C2 between the input terminal (12) of the shunt and the anode (17) of the diode D2.

5. Device according to claim 4, characterized in that the floating amplifier (15) is supplied at a voltage double the supply voltage of the shunt (8), before chopping.

6. Device according to claim 1, characterized in that it is used in an electrical power steering for an automotive vehicle.

* * * * *